(12) United States Patent
Ishimoto et al.

(10) Patent No.: US 12,444,625 B2
(45) Date of Patent: Oct. 14, 2025

(54) CHIP PEELING APPARATUS AND CHIP PEELING METHOD USING THE SAME

(71) Applicant: Samsung Electronics Co., Ltd., Suwon-si (KR)

(72) Inventors: Tatsuya Ishimoto, Yokohama (JP); Naoyuki Takada, Yokohama (JP); Takahiro Tokumiya, Yokohama (JP); Masato Kajinami, Yokohama (JP)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 413 days.

(21) Appl. No.: 18/062,830

(22) Filed: Dec. 7, 2022

(65) Prior Publication Data

US 2023/0178394 A1    Jun. 8, 2023

(30) Foreign Application Priority Data

Dec. 8, 2021  (JP) ................................. 2021-199182
Oct. 12, 2022  (KR) ........................ 10-2022-0130919

(51) Int. Cl.
H01L 21/67 (2006.01)

(52) U.S. Cl.
CPC .............................. H01L 21/67132 (2013.01)

(58) Field of Classification Search
CPC ..... H01L 21/76132; H01L 2221/68386; H01L 2924/35121; B32B 43/006
See application file for complete search history.

(56) References Cited

U.S. PATENT DOCUMENTS

| 4,737,824 | A | * | 4/1988 | Sakai | ...................... G03F 7/707 |
| | | | | | 355/73 |
| 9,039,867 | B2 | | 5/2015 | Barmettler et al. | |
| 11,024,543 | B2 | | 6/2021 | Harada et al. | |
| 2007/0277929 | A1 | * | 12/2007 | Trinks | ............... H01L 21/67132 |
| | | | | | 156/707 |
| 2019/0304852 | A1 | * | 10/2019 | Seyama | .............. H01L 21/6835 |
| 2019/0333800 | A1 | * | 10/2019 | Heo | ................... H01L 21/67288 |

FOREIGN PATENT DOCUMENTS

| JP | H02111044 | A | | 4/1990 | |
| JP | 2004/165244 | A | | 6/2004 | |
| JP | 2005/302932 | A | | 10/2005 | |
| JP | 4816598 | B2 | | 11/2011 | |
| JP | 5184303 | B2 | | 4/2013 | |
| JP | 2013/214739 | A | | 10/2013 | |
| JP | 2016063057 | A | * | 4/2016 | |
| JP | 2020/174117 | A | | 10/2020 | |
| KR | 20200049002 | A | * | 5/2020 | ....... H01L 21/67132 |

* cited by examiner

*Primary Examiner* — George R Koch
(74) *Attorney, Agent, or Firm* — HARNESS, DICKEY & PIERCE, P.L.C.

(57) ABSTRACT

A chip peeling apparatus may include a peeling device. The peeling device may include a plurality of vacuum adsorption holes and a plurality of first air blow holes arranged around the plurality of vacuum adsorption holes. The peeling device may be configured to peel a chip off a tape when the peeling device is arranged below a region of the tape on which the chip is attached, vacuum pressure is applied through the plurality of vacuum adsorption holes to adsorb the peeling device to the region of the tape, and a first air blow is directed through the plurality of first air blow holes to the region of the tape.

16 Claims, 10 Drawing Sheets

CHIP PEELING APPARATUS AND CHIP PEELING METHOD USING THE SAME

CROSS-REFERENCE TO RELATED APPLICATIONS

This application claims the benefit of Japanese Patent Application No. 2021-199182, filed on Dec. 8, 2021, in the Japanese Patent Office and Korean Patent Application No. 10-2022-0130919, filed on Oct. 12, 2022, in the Korean Intellectual Property Office, the disclosures of which are incorporated herein in their entireties by reference.

BACKGROUND

Inventive concepts relate to a chip peeling apparatus and/or a chip peeling method using the same, and more particularly, to a chip peeling apparatus capable of easily peeling a chip off a tape and/or a chip peeling method using the same.

Semiconductor manufacturing processes may include a die bonding process in which a diced chip is peeled off by a chip peeling apparatus, picked up, and mounted on another wafer. In a conventional chip peeling method, a chip may be pushed up from a tape (for example, a dicing tape) by a sharp pin.

However, when a thin chip (for example, a chip with each of horizontal and vertical sizes of 10 mm and a thickness of 30 μm or less) is pushed up by a sharp pin, the end of the pin may become a starting point that may cause cracks in the chip.

SUMMARY

Inventive concepts relate to a chip peeling apparatus capable of easily peeling a chip off a tape without causing cracks and/or a chip peeling method using the same.

According to an embodiment of inventive concepts, a chip peeling apparatus may include a peeling device. The peeling device may include a plurality of vacuum adsorption holes and a plurality of first air blow holes arranged around the plurality of vacuum adsorption holes. The peeling device may be configured to peel a chip off a tape when the peeling device is arranged below a region of the tape on which the chip is attached, vacuum pressure is applied through the plurality of vacuum adsorption holes to adsorb the peeling device to the region of the tape, and a first air blow is directed through the plurality of first air blow holes to the region of the tape.

According to an embodiment of inventive concepts, a chip peeling apparatus may include a peeling device and a pickup device above the peeling device. The peeling device may include a plurality of vacuum adsorption holes and a plurality of first air blow holes arranged around the plurality of vacuum adsorption holes. The pickup device may be configured to adsorb a top surface of chip and to pick up the chip off a tape when the peeling device is below the tape and used to peel the chip off the tape.

According to another aspect of inventive concepts, a chip peeling apparatus may include a peeling device, a pickup device, and an infrared camera. The peeling device may include a plurality of vacuum adsorption holes and a plurality of first air blow holes arranged around the plurality of vacuum adsorption holes. The pickup device may be above the peeling device. The pickup device may be configured to adsorb a top surface of a chip and to pick up the chip off a tape when the peeling device is below the tape and used to peel the chip off the tape. The infrared camera may be at one side of the pickup device and may be configured to capture an image of the tape over the chip.

According to an embodiment of inventive concepts, a chip peeling method may include peeling a chip off a tape using a peeling device below the tape. The peeling device may include a plurality of vacuum adsorption holes and a plurality of first air blow holes arranged around the plurality of vacuum adsorption holes. The peeling the chip off the tape may include adsorbing the peeling device to a region of the tape on which the chip is attached by applying vacuum pressure to the region of the tape through the plurality of vacuum adsorption holes and directing a first air blow through the plurality of first air blow holes to the region of the tape.

BRIEF DESCRIPTION OF THE DRAWINGS

Embodiments will be more clearly understood from the following detailed description taken in conjunction with the accompanying drawings in which.

DETAILED DESCRIPTION

Figure 1:
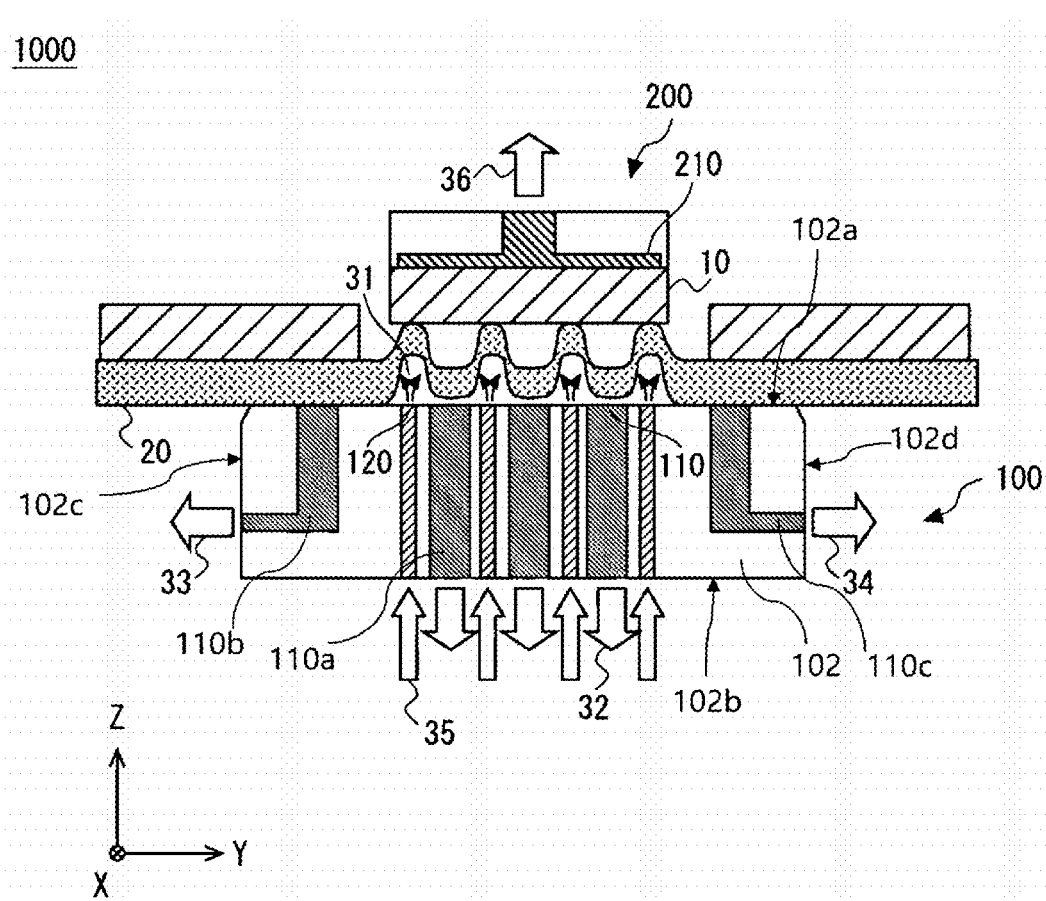
FIG. 1 is a schematic side view of a chip peeling apparatus according to an example embodiment.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Hereinafter, embodiments of inventive concepts will be described in detail with reference to the accompanying drawings. In the current specification, thicknesses or sizes of the respective layers may be exaggerated for convenience sake and may be different from real shapes and ratios.

Like reference numerals refer to like elements throughout and a duplicative description thereof will not be given.

FIG. 1 may be a schematic side view illustrating a configuration of a chip peeling apparatus 1000 according to an example embodiment. The chip peeling apparatus 1000 peels a chip 10 off a tape 20. The chip 10 may be attached to a top surface of the tape 20. The chip 10 may be located on the top surface of the tape 20. The tape 20 may be, for example, a dicing tape.

In this case, in a preceding dicing process, individual chips 10 may be divided into wafers fixed to the tape 20. The tape 20 may be integrated with a wafer ring (not shown). The chip peeling apparatus 1000 may be used to peel a chip off a tape other than the dicing tape.

In FIG. 1, three-dimensional Cartesian coordinates of an X-axis, a Y-axis, and a Z-axis are illustrated for clarification. A Z-axis direction is a vertical direction parallel to a thickness direction of the chip 10. The Z-axis direction is the thickness direction of the chip 10 and becomes a height direction. The X-axis direction and the Y-axis direction are parallel to a surface of the chip 10.

The chip peeling apparatus 1000 may include a peeling device 100 and a pickup device 200. The peeling device 100 may be arranged below the tape 20, and the pickup device 200 may be arranged above the chip 10.

The peeling device 100 may be referred to as an ejector device. The peeling device 100 may include a peeling body 102 having a top surface 102a, a bottom surface 102b, a first side 102c, and a second side 102d opposite to the first side 102c. The peeling device 100 includes a plurality of vacuum adsorption holes 110 and a plurality of first air blow holes 120, which may extend through the peeling device 100.

The plurality of vacuum adsorption holes 110 may be connected to a vacuum adsorption source (not shown), such as a vacuum pump. Each of the plurality of vacuum adsorption holes 110 may be referred to as a vacuum port. The plurality of vacuum adsorption holes 110 neighboring in the X-axis direction may be apart from one another at equal intervals. Pressure of vacuum adsorption from the plurality of vacuum adsorption holes 110 may be, for example, about 70 kPa to about 83 kPa.

The plurality of vacuum adsorption holes 110 may include a first vacuum adsorption hole 110a passing between the top surface 102a and the bottom surface 102b of the peeling body 102, a second vacuum adsorption hole 110b passing between the top surface 102a and the first side 102c of the peeling body 102, and a third vacuum adsorption hole 110c passing between the top surface 102a and the second side 102d of the peeling body 102.

The plurality of first air blow holes 120 may pass between the top surface 102a and the bottom surface 102b of the peeling body 102. The plurality of first air blow holes 120 may be connected to a pressing source (not shown) ejecting air, such as compressed air. The plurality of first air blow holes 120 may be referred to as pressure ports. Pressure of first air blow from the plurality of first air blow holes 120 is, for example, about 0.2 MPa to about 0.6 MPa. A flow of air ejected from each of the plurality of first air blow holes 120 is marked with a set of arrows 31.

A top surface of the peeling device 100 may be in contact with a bottom surface of the tape 20. From the plurality of vacuum adsorption holes 110, vacuum pressure may be applied in a Z-axis reverse direction (a −Z-axis direction) as marked with arrows 32, in a Y-axis reverse direction (a −Y-axis direction) as marked with an arrow 33, or in a Y-axis forward direction (a +Y-axis direction) as marked with an arrow 34 so that evacuation may be performed.

In other words, the first vacuum adsorption hole 110a may be connected to the vacuum adsorption source and vacuum pressure may be applied from the first vacuum adsorption hole 110a in the Z-axis reverse direction (the −Z-axis direction) parallel to the thickness direction of the chip 10 so that evacuation may be performed. In other words, the second vacuum adsorption hole 110b may be connected to the vacuum adsorption source and vacuum pressure may be applied from the second vacuum adsorption hole 110b in the Y-axis reverse direction (the −Y-axis direction) parallel to the surface of the chip 10 so that evacuation may be performed. In other words, the third vacuum adsorption hole 110c may be connected to the vacuum adsorption source and vacuum pressure may be applied from the third vacuum adsorption hole 110c in the Y-axis forward direction (the +Y-axis direction) parallel to the surface of the chip 10 so that evacuation may be performed.

In FIG. 1, it is illustrated that vacuum pressure is applied from the second vacuum adsorption hole 110b and the third vacuum adsorption hole 110c so that evacuation may be performed in the Y-axis reverse direction (the −Y-axis direction) and in the Y-axis forward direction (the +Y-axis direction). However, vacuum pressure may be applied from the second vacuum adsorption hole 110b and the third vacuum adsorption hole 110c so that evacuation may be performed in the X-axis reverse direction (the −X direction) and an X-axis forward direction (the +X-axis direction). In addition, air may be supplied to the plurality of first air blow holes 120 in a Z-axis forward direction (the +Z-axis direction) as marked with arrows 35.

In FIG. 1, it is illustrated that the plurality of vacuum adsorption holes 110 include the first vacuum adsorption hole 110a, the second vacuum adsorption hole 110b, and the third vacuum adsorption hole 110c. However, the peeling device 100 may include only one of the first vacuum adsorption hole 110a, the second vacuum adsorption hole 110b, and the third vacuum adsorption hole 110c.

Figure 2:
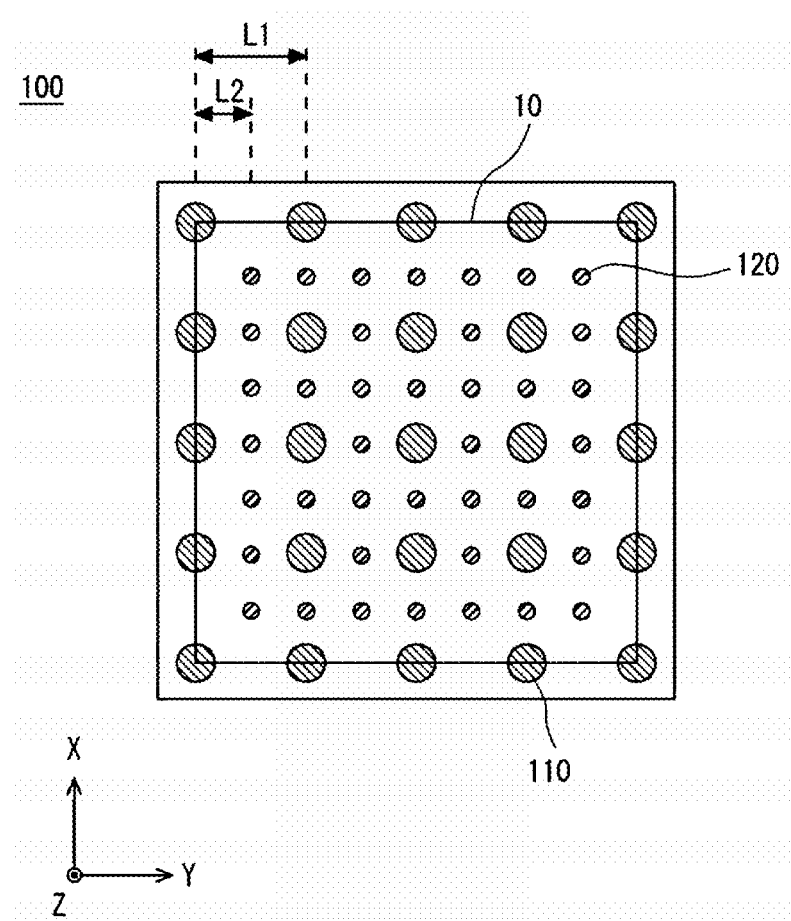
FIG. 2 is a schematic top view of a chip peeling apparatus according to an example embodiment.

FIG. 2 is a schematic top view of the peeling device 100. In FIG. 2, an example of a shape of the chip 10 is marked with a solid line. In addition, as described later, the peeling device 100 may correspond to peeling of the chip 10 having one of various sizes. The peeling device 100 includes the plurality of vacuum adsorption holes 110 and the plurality of first air blow holes 120.

The plurality of vacuum adsorption holes 110 are arranged in a substantially square lattice shape. The plurality of vacuum adsorption holes 110 may be arranged to correspond to the chip 10. The plurality of vacuum adsorption holes 110 may include circular vacuum adsorption holes. The plurality of vacuum adsorption holes 110 may be apart from one another in the X-axis direction and the Y-axis direction parallel to the surface of the chip 10 in a plane.

The plurality of vacuum adsorption holes 110 may be apart from one another in the X-axis direction and the Y-axis direction on a plane in the X-axis direction and the Y-axis direction. A distance L1 between each two of the plurality of vacuum adsorption holes 110 neighboring in the X-axis direction or the Y-axis direction may be, for example, about 1 mm.

The plurality of first air blow holes 120 are arranged around the plurality of vacuum adsorption holes 110, respectively. The plurality of first air blow holes 120 may be apart from one another in the X-axis direction and the Y-axis direction on a plane in the X-axis direction and the Y-axis direction.

In FIG. 2, each of the plurality of vacuum adsorption holes 110 may be surrounded by the plurality of first air blow holes 120. In addition, in the chip peeling apparatus 1000 according to an example embodiment, a plurality of vacuum adsorption holes 110 may surround each of the plurality of first air blow holes 120. That is, the plurality of first air blow holes 120 may be arranged on an outer circumference of each of the plurality of vacuum adsorption holes 110 or each of the plurality of first air blow holes 120 may be arranged on an inner circumference of the plurality of vacuum adsorption holes 110.

In FIG. 2, a distance L2 between each two of the plurality of first air blow holes 120 neighboring in the X-axis direction or the Y-axis direction is approximately half of the distance L1. According to such an arrangement, although the first air blow is performed, the tape 20 is not peeled off the plurality of vacuum adsorption holes 110. A size (for example, a diameter of 0.2 mm or less) of each of the plurality of first air blow holes 120 may be less than a size (for example, a diameter of 1 mm) of each of the plurality of vacuum adsorption holes 110. Accordingly, air ejected from the plurality of first air blow holes 120 may be limited and/or prevented from flowing into the plurality of vacuum adsorption holes 110. Each of the plurality of first air blow holes 120 may have a very small diameter.

Figure 3:
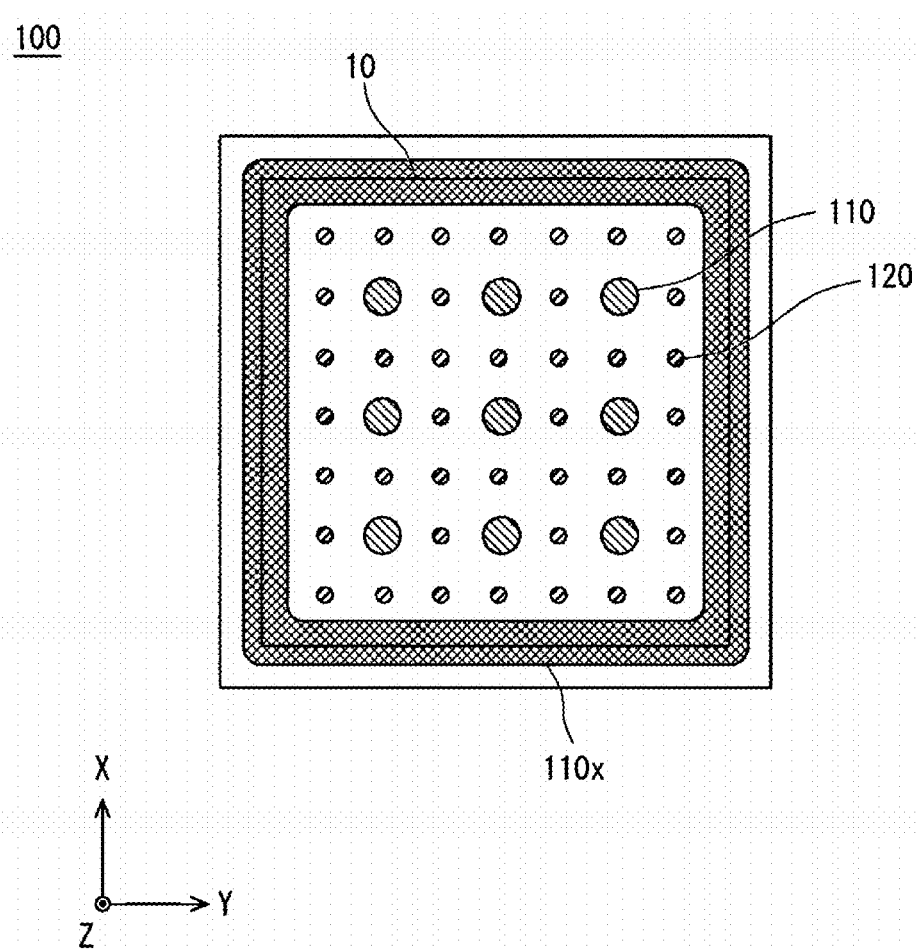
FIG. 3 is a schematic diagram illustrating a top surface of a chip peeling apparatus according to an example embodiment.

A shape of each of the plurality of vacuum adsorption holes 110 is not limited to a circle. FIG. 3 is a schematic diagram illustrating the top surface of the peeling device 100. An example of a shape of the chip 10 is marked with a solid line. Comparing FIG. 2 with FIG. 3, the plurality of vacuum adsorption holes 110 arranged on an outer circumference of the chip 10 are replaced by a plurality of groove-shaped vacuum adsorption holes 110x. In other words, the peeling device 100 of FIG. 3 may further include a line-type vacuum adsorption hole 110x. The line-type vacuum adsorption hole 110x may be arranged to correspond to the outer circumference of the chip 10. A shape of each of the plurality of first air blow holes 120 is not limited to a circle, and may be a groove.

Referring to FIG. 1, an adsorption groove 210 may be provided on a bottom surface of the pickup device 200. The pickup device 200 may adsorb a top surface of the chip 10 by the adsorption groove 210 to pick up the chip 10. The bottom surface of the pickup device 200 may be in contact with the top surface of the chip 10. Vacuum pressure may be applied from the adsorption groove 210 formed in the bottom surface of the pickup device 200 so that evacuation may be performed in the Z-axis forward direction as marked with an arrow 36.

Next, an example of a chip peeling method according to an example embodiment will be described with reference to FIG. 1. First, a diced wafer may be arranged above the peeling device 100. Next, alignment of the peeling device 100 and the chip 10 to be peeled off may be performed. Next, the tape 20 may be vacuum-adsorbed by using the plurality of vacuum adsorption holes 110 of the peeling device 100.

Next, after arranging the pickup device 200 (referred to as a pickup head) above the chip 10, the pickup device 200 is lowered to approach the chip 10. When the pickup device 200 reaches a position in which the chip 10 may be adsorbed, the chip 10 is adsorbed by the adsorption groove 210. Finally, the first air blow from the plurality of first air blow holes 120 of the peeling device 100 is initiated to promote peeling of the chip 10, and at the same time, to raise the pickup device 200 so that the chip 10 is peeled off the tape 20.

The peeling device 100 may peel the chip 10 off the tape 20 by adsorbing the tape 20 by vacuum pressure from the plurality of vacuum adsorption holes 110 and by the first air blow from the plurality of first air blow holes 120. That is, the tape 20 is peeled off in positions of the plurality of vacuum adsorption holes 110 by performing vacuum adsorption while locally lifting the tape 20 from below by pressure from the plurality of first air blow holes 120. Accordingly, an adhesive area between the chip 10 and the tape 20 is reduced so that the pickup device 200 may easily pick up the chip 10.

Figure 4:
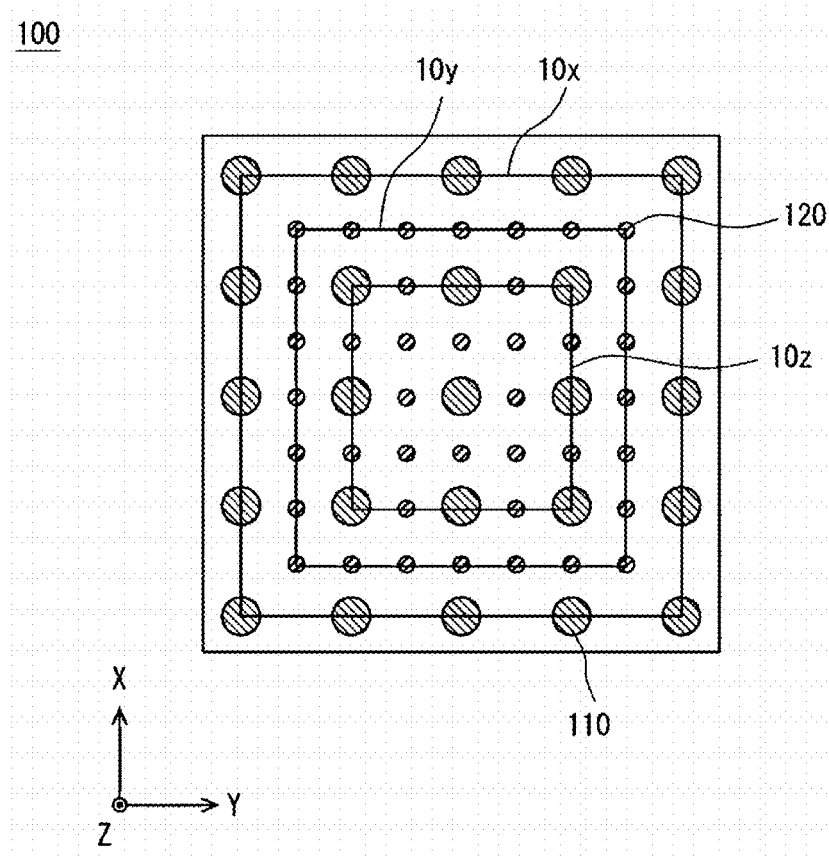
FIG. 4 is a schematic diagram illustrating a chip size in a chip peeling apparatus according to an example embodiment.

The chip peeling apparatus 1000 may correspond to peeling of the chip 10 of one of various sizes. FIG. 4 is a schematic diagram illustrating a size of the chip 10 to which the chip peeling apparatus 1000 may correspond. The peeling device 100 illustrated in FIG. 4 may correspond to peeling of a chip 10x, a chip 10y, or a chip 10z.

Figure 5:
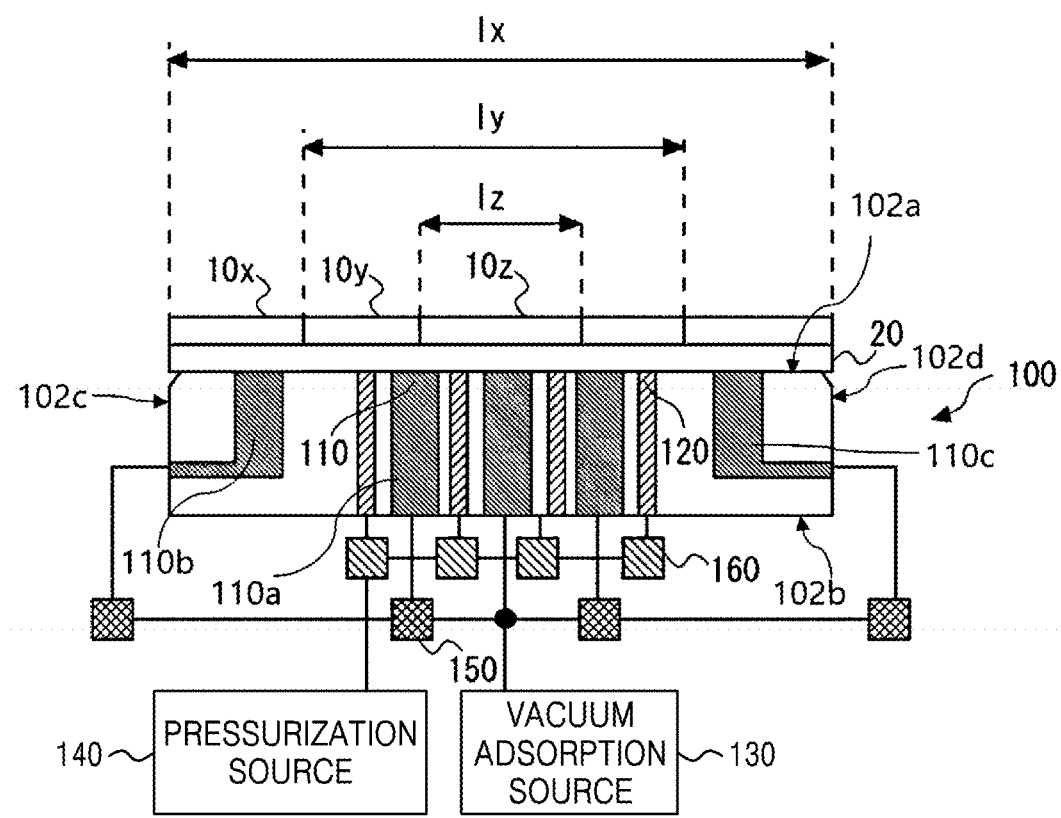
FIG. 5 is a schematic diagram illustrating an arrangement of a value in a chip peeling apparatus according to an example embodiment.

FIG. 5 is a schematic side view of the peeling device 100 illustrated in FIG. 4. The chips 10x, 10y, and 10z have widths 1x, 1y, and 1z, respectively. The peeling device 100 includes a vacuum adsorption source 130, a pressurization source 140, a plurality of vacuum valves 150, and a plurality of pressurization valves 160. The plurality of vacuum valves 150 connect the vacuum adsorption source 130 to the plurality of vacuum adsorption holes 110. For example, when plurality of vacuum valves 150 are open, the plurality of vacuum valves 150 may be in fluid communication through a conduit with the vacuum adsorption source 130 and the plurality of vacuum adsorption holes 110 for applying vacuum pressure to the tape 20 through the plurality of vacuum adsorption holes 110. The vacuum adsorption source 130 may be a pump for applying vacuum pressure to the tape 20 through the plurality of vacuum valves 150 and the plurality of vacuum adsorption holes 110. The pressurization source 130 may be a blower or a pump for providing pressurized gas (e.g., pressurized air) through the plurality of first air blow holes 120. When the plurality of pressurization valves 160 are open, the pressurization source 130 may be in fluid communication with the plurality of first air blow holes 120 through a conduit connecting the pressurization source 130, the plurality of pressurization valves 160, and the plurality of first air blow holes 120.

The plurality of pressurization valves 160 may connect the pressurization source 140 to the plurality of first air blow holes 120. The plurality of vacuum valves 150 may be provided for the plurality of vacuum adsorption holes 110, respectively. The plurality of pressurization valves 160 may be provided for the plurality of first air blow holes 120, respectively.

Opening and closing of each of the plurality of pressurization valves 160 is set in accordance with the size of the chip 10. Specifically, the pressurization valves 160 connected to the first air blow holes 120 outside the outer circumference of the chip 10 to be peeled off the tape 20 are closed, and the other pressurization valves 160 are opened. Accordingly, the peeling device 100 may correspond to peeling of the chip 10 of one of various sizes.

The peeling device 100 may locally lift the tape 20 by performing pressurization from the plurality of first air blow holes 120 while adsorbing the tape 20 by the plurality of vacuum adsorption holes 110. The peeling device 100 may peel the chip 10 from an edge of the chip 10 toward the center of the chip 10 by controlling the plurality of pressurization valves 160 to change a region in which the tape 20 is lifted. In addition, the peeling device 100 may peel the chip 10 with the center of the chip 10 as a starting point.

The chip peeling apparatus 1000 according to an example embodiment peels the chip by adsorption by vacuum pressure from the plurality of vacuum adsorption holes 110 and by the first air blow from the plurality of first air blow holes 120. Therefore, because the chip peeling apparatus 1000 may peel the chip only by controlling pressure of air, the chip peeling apparatus 1000 may be simple and miniaturized.

In addition, because air is used by the chip peeling apparatus 1000 according to an example embodiment, peeling may be continuously performed. Furthermore, in the chip peeling apparatus 1000 according to an example embodiment, because it is not necessary to mechanically contact a needle or pin with the chip 10, cracks of the chip 10 may be reduced.

Figure 6:
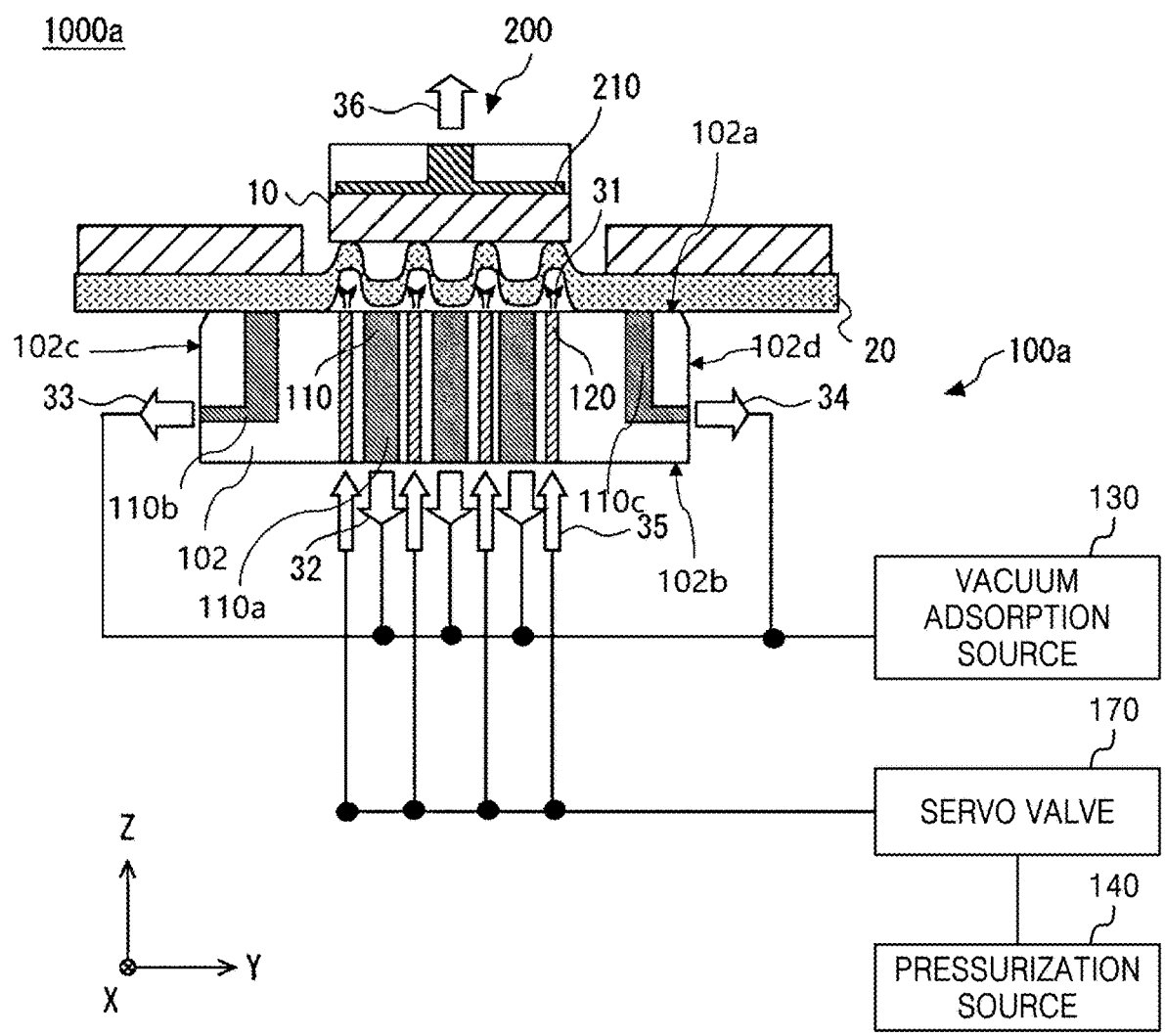
FIG. 6 is a schematic side view of a chip peeling apparatus according to an example embodiment.

FIG. 6 is a schematic side view illustrating a configuration of a chip peeling apparatus 1000a according to an example embodiment. Comparing FIG. 1 with FIG. 6, the peeling device 100 is replaced by a peeling device 100a. The peeling device 100a includes a servo valve 170 connecting the plurality of first air blow holes 120 and the pressurization source 140.

In addition, the plurality of pressurization valves 160 (refer to FIG. 5) may electrically control the opening and closing thereof. In addition, the peeling device 100a includes the vacuum adsorption source 130 like the chip peeling apparatus 1000.

The peeling device 100a repeatedly opens and closes the servo valve 170 when the chip 10 is peeled off the tape 20. In other words, when the chip 10 is peeled off the tape 20, the peeling device 100a repeatedly turns on and off the first air blow from the plurality of first air blow holes 120. The on/off of the first air blow may be switched to, for example, a time of about several tens of ms (e.g., 30 to 80 ms).

When the tape 20 is locally pushed up by the first air blow and then, the first air blow is stopped, a part of the tape 20, from which the chip 10 is peeled, moves in the Z-axis reverse direction (the −Z-axis direction). Accordingly, when the first air blow is repeatedly turned on and off, the part of the tape 20, from which the chip 10 is peeled, repeats an up-and-down motion. Therefore, the peeling of the chip 10 may be promoted. When the first air blow is repeatedly turned on and off, the chip 10 and the tape 20 may be lifted in the Z-axis forward direction (the +Z-axis direction) by the pickup device 200.

A closing period (for example, 60 ms) of the servo valve 170 may be longer than an opening period (for example, 30 ms) of the servo valve 170. Accordingly, because a time for the part of the tape 20, from which the chip 10 is peeled, to return to an original position may be secured, the peeling of the chip 10 may be further promoted.

Figure 7:
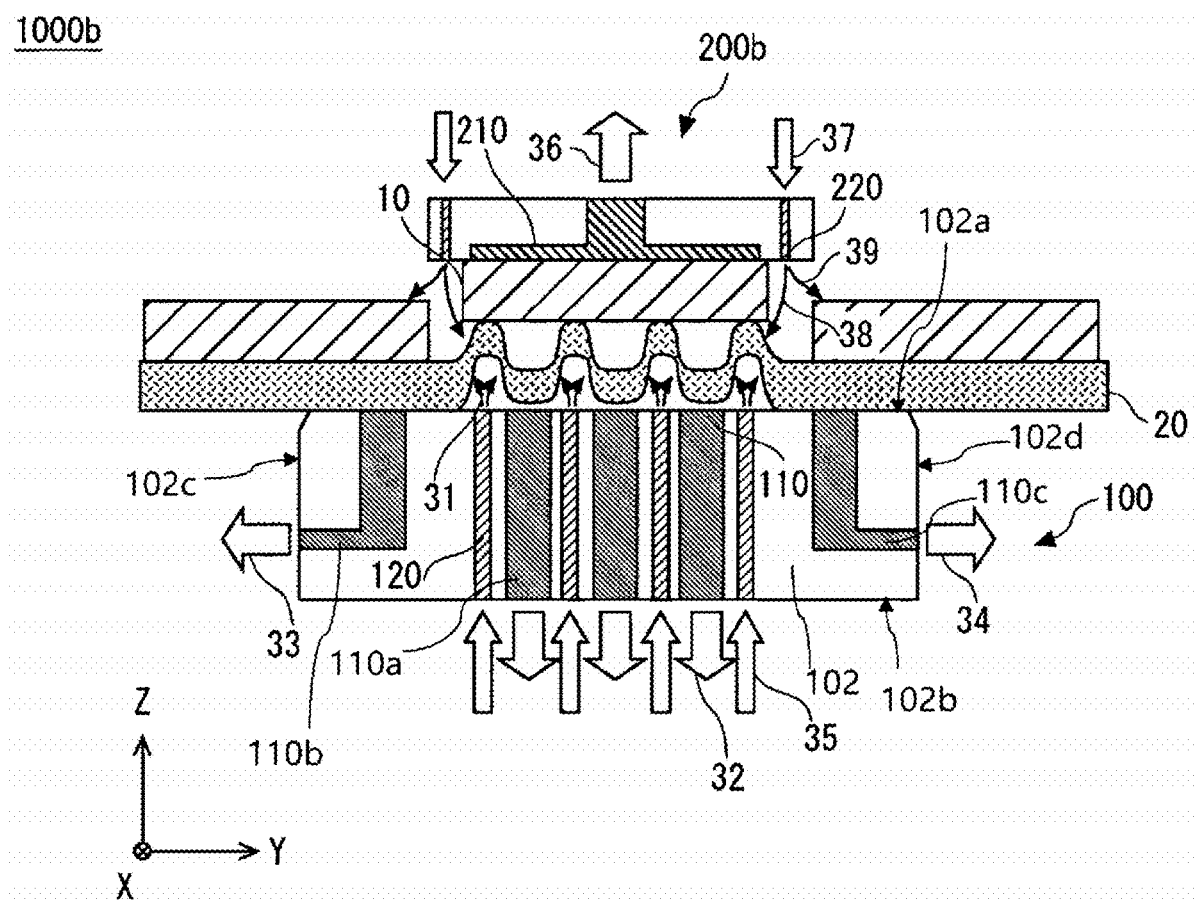
FIG. 7 is a schematic side view of a chip peeling apparatus according to an example embodiment.

FIG. 7 is a schematic side view illustrating a configuration of a chip peeling apparatus 1000b according to an example embodiment. Comparing FIG. 1 with FIG. 7, the pickup device 200 is replaced by a pickup device 200b. A bottom surface of the pickup device 200b includes second air blow holes 220 in addition to the adsorption groove 210.

The second air blow holes 220 are arranged outside the outer circumference of the chip 10. The second air blow holes 220 are arranged around the adsorption groove 210. In addition, air is supplied to the second air blow holes 220 in the Z-axis reverse direction (the −Z-axis direction) as marked with arrows 37.

The pickup device 200b may perform a second air blow from the second air blow holes 220, for example, at a timing at which the edge of the chip 10 is peeled off the tape 20. Some of air from the second air blow holes 220 is supplied between the chip 10 and the tape 20 as marked with arrows 38 to promote the peeling of the chip 10.

Some of air from the second air blow holes 220 may flow around other chips as marked with arrows 39. The chip peeling apparatus 1000b according to an example embodiment may easily peel the chip 10 off the tape 20 by performing the second air blow from the pickup device 200b.

Figure 8:
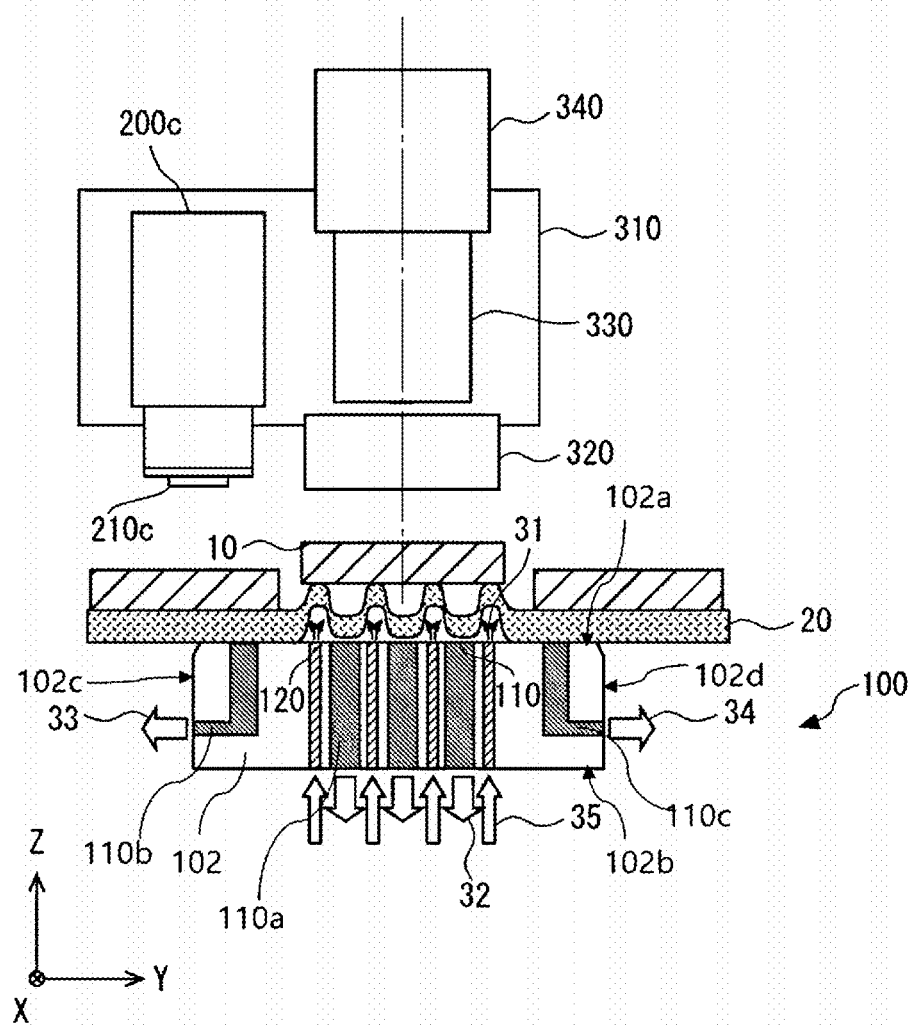
FIG. 8 is a schematic side view of a chip peeling apparatus according to an example embodiment.

FIG. 8 is a schematic side view illustrating a configuration of a chip peeling apparatus 1000c according to an example embodiment. Comparing FIG. 1 with FIG. 8, the pickup device 200 is replaced by a pickup device 200c, and a casing 310, a light 320, a lens barrel 330, and an infrared camera 340 are added.

The pickup device 200c includes a suction unit 210c. The suction unit 210c corresponds to the adsorption groove 210 of FIG. 1. The pickup device 200c is accommodated in the casing 310. The casing 310 accommodates the pickup device 200c, the light 320, the lens barrel 330, and the infrared camera 340.

The pickup device 200c is accommodated on the Y-axis reverse direction (the −Y-axis direction) side of the casing 310. The light 320, the lens barrel 330, and the infrared camera 340 are accommodated on the Y-axis forward direction (the +Y-axis direction) side of the casing 310. As marked with a dash-dotted line, the light 320, the lens barrel 330, and the infrared camera 340 are arranged right above the chip 10.

The light 320 as a light source illuminating the tape 20 with infrared light may be, for example, light emitting diode (LED) ring light. Because the light 320 uses infrared light, the tape 20 may be illuminated over the chip 10.

The lens barrel 330 includes a lens and derives infrared light from the tape 20 to the infrared camera 340. Infrared light from the tape 20 passes through the chip 10. Infrared light from the tape 20 is incident on the infrared camera 340. The infrared camera 340 captures the tape 20 over the chip 10.

Figure 9:
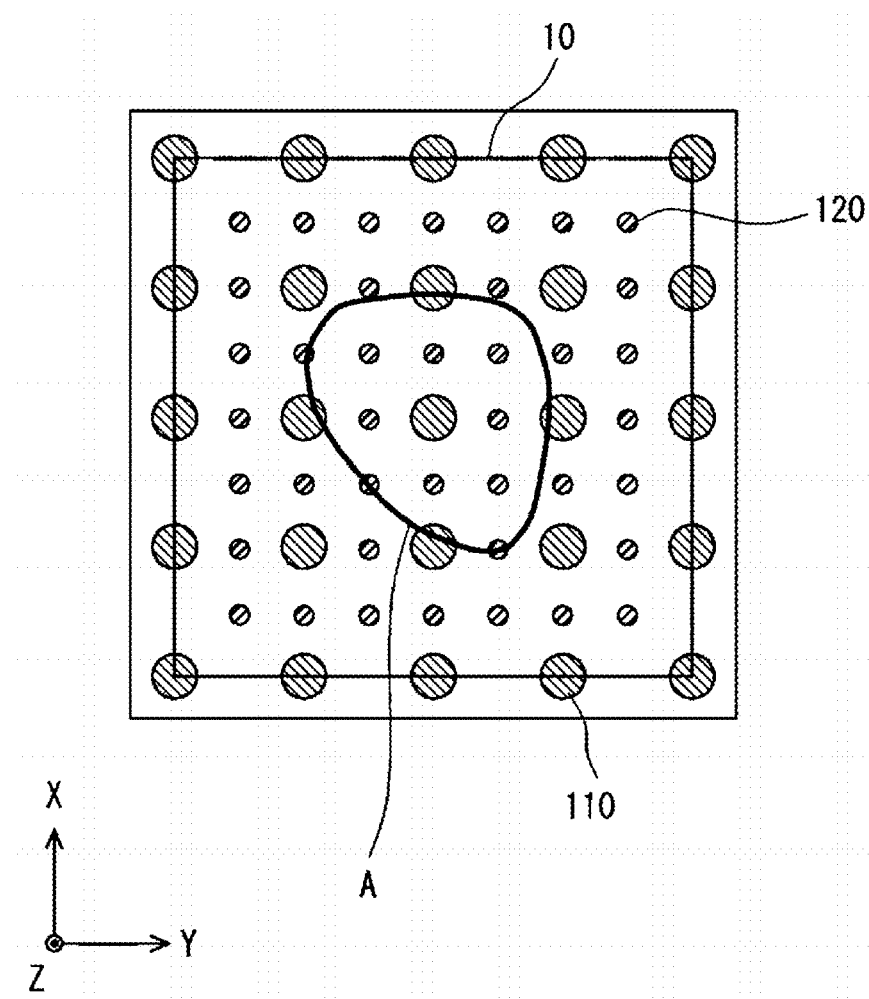
FIG. 9 is a schematic diagram illustrating a captured image of an infrared camera in a chip peeling apparatus according to an example embodiment.

FIG. 9 is a schematic diagram illustrating a captured image of the infrared camera 340. In FIG. 9, the chip 10, the plurality of vacuum adsorption holes 110, and the plurality of first air blow holes 120 are illustrated. In an unpeeled region A in the center, the chip 10 is not peeled off the tape 20. Because the brightness of the unpeeled region A is different from that of a peeled region, the unpeeled region A may be identified from the captured image of the infrared camera 340. Therefore, it is possible to determine whether the chip 10 is sufficiently peeled off the tape 20 based on a size of the unpeeled region A or a contrast difference between the unpeeled region A and the other region.

Figure 10:
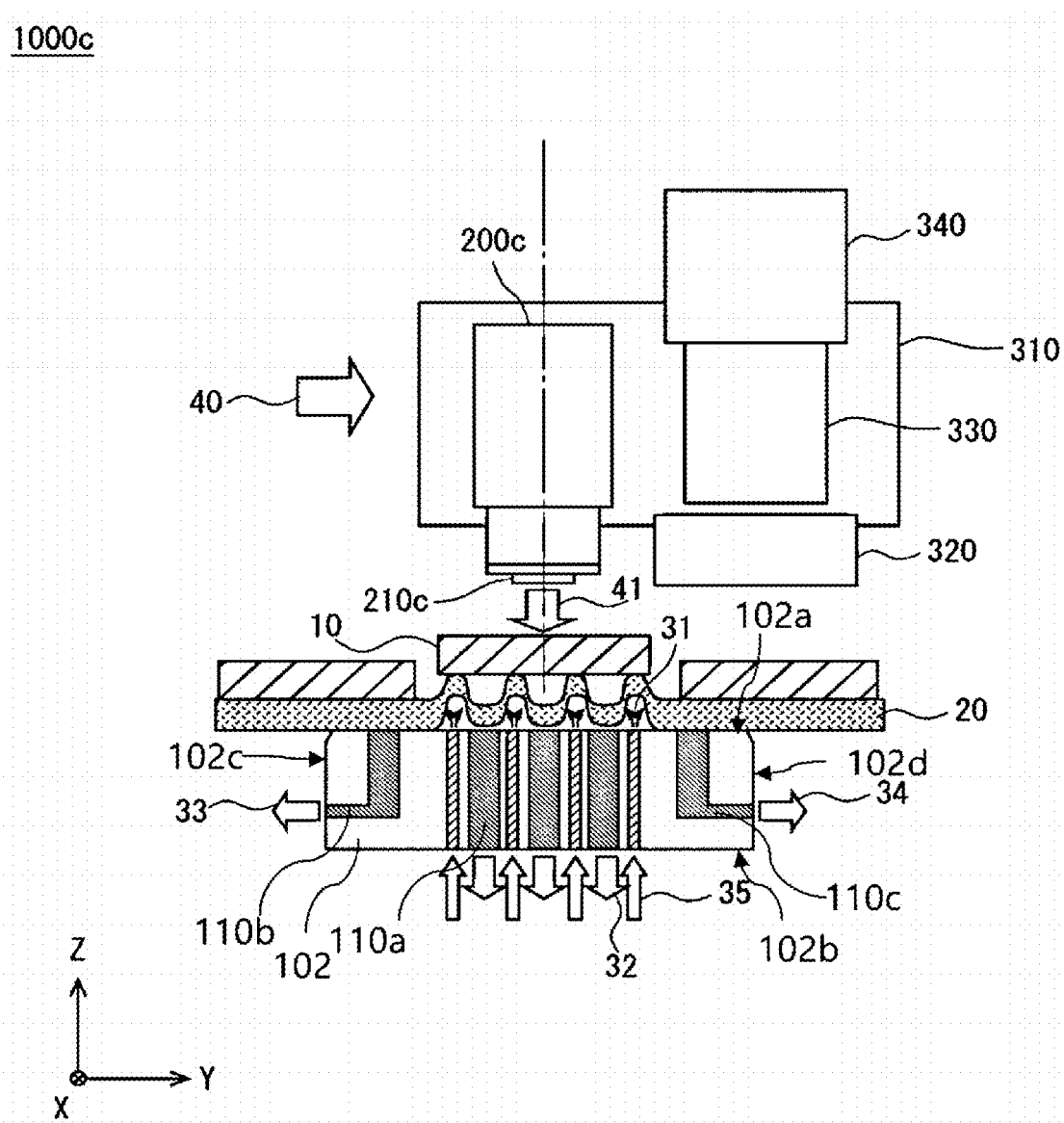
FIG. 10 is a schematic diagram illustrating a method of moving a pickup device in a chip peeling apparatus according to an example embodiment.

When it is determined that the chip 10 is sufficiently peeled off the tape 20 based on the captured image of the infrared camera 340, the chip peeling apparatus 1000c moves the pickup device 200c to a pickup position. The pickup position means a position in which the chip 10 may be picked up. FIG. 10 is a schematic diagram illustrating an overview of a method of moving the pickup device 200c.

When the chip 10 is sufficiently peeled off the tape 20, the casing 310 moves in the X-axis forward direction as marked with an arrow 40. At this time, as marked with a dash-dotted line, the pickup device 200c is arranged right above the chip 10. Next, the casing 310 moves in the Z-axis reverse direction (the −Z-axis direction) as marked with an arrow 41. Accordingly, the pickup device 200c moves the chip 10 to the position in which the chip 10 may be picked up.

The chip peeling apparatus 1000c according to an example embodiment may check a peeling state of the chip 10 to pick up the chip 10. Accordingly, the chip peeling apparatus 1000c according to an example embodiment may reduce peeling failure of the chip 10.

Although not illustrated, the chip peeling apparatuses 1000, 1000a, 1000b, and 1000c may include a controller for controlling operations of the chip peeling apparatuses 1000, 1000a, 1000b, and 1000c described herein. The controller may include processing circuitry, a memory, power circuitry, and an input/output device, but is not limited thereto. The memory may include a nonvolatile memory (e.g., a flash memory) and/or a volatile memory (e.g., SRAM, DRAM). The input and output device may be a keyboard and/or a touch screen for receiving commands from an operator and/or a network interface for receiving commands from an external host. The memory may store an operating system and/or instructions that, when executed by the processing circuitry of the controller, transform the controller into a special-purpose controller for operating components of the chip peeling apparatuses 1000, 1000a, 1000b, and 1000c to control operations thereof. The processing circuitry may include hardware having logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The controller may be connected to components of the operations of the chip peeling apparatuses 1000, 1000a, 1000b, and 1000c, such as the peeling devices 100, 100a, 100b, and 100c, the light 320, the camera 340, and the pickup devices 200, 200a, 200b, and 200c described above, and may be configured to provide commands and power for controlling the operations of the components of the operations of the chip peeling apparatuses 1000, 1000a, 1000b, and 1000c.

While inventive concepts has been particularly shown and described with reference to embodiments thereof, it will be understood that various changes in form and details may be made therein without departing from the spirit and scope of inventive concepts. Descriptions of features or aspects within each embodiment should typically be considered as available for other similar features or aspects in other embodiments. For example, configurations of the chip peeling apparatuses 1000, 1000a, 1000b, and 1000c may be combined with one another.

While inventive concepts has been particularly shown and described with reference to embodiments thereof, it will be understood that various changes in form and details may be made therein without departing from the spirit and scope of the following claims.

What is claimed is:

1. A chip peeling apparatus comprising:
 a peeling device,
 the peeling device including a plurality of vacuum adsorption holes and a plurality of first air blow holes arranged surrounding the plurality of vacuum adsorption holes,
 wherein the peeling device is configured to peel a chip off a tape when the peeling device is arranged below a region of the tape on which the chip is attached, vacuum pressure is applied through the plurality of vacuum adsorption holes to adsorb the peeling device to the region of the tape, and a first air blow is directed through the plurality of first air blow holes to the region of the tape,
 the peeling device comprises a peeling body,
 the plurality of vacuum adsorption holes comprise a first vacuum adsorption hole passing through the peeling body from a top surface of the peeling body to a bottom surface of the peeling body, a second vacuum adsorption hole passing through the peeling body from the top surface of the peeling body to a first side surface of the peeling body, and a third vacuum adsorption hole passing through the peeling body from the top surface of the peeling body to a second side surface of the peeling body, and
 the second side surface of the peeling body is opposite the first side surface of the peeling body.

2. The chip peeling apparatus of claim 1, wherein
 the peeling device further includes a plurality of pressurization valves and a pressurization source,
 the plurality of pressurization valves are connected to the plurality of first air blow holes,
 the pressurization source is connected to the plurality of pressurization valves, and
 the peeling device is configured to set opening and closing of each of the plurality of pressurization valves in accordance with a size of the chip.

3. The chip peeling apparatus of claim 1, wherein
 the peeling device further comprises a servo valve connected to the plurality of first air blow holes, and
 the peeling device is configured to repeatedly open and close the servo valve when the chip is peeled off the tape.

4. The chip peeling apparatus of claim 3, wherein a closing period of the servo valve is longer than an opening period of the servo valve.

5. The chip peeling apparatus of claim 1, further comprising:
 a plurality of vacuum valves; and
 a vacuum adsorption source, wherein
 the first vacuum adsorption hole, the second vacuum adsorption hole, and the third vacuum adsorption hole are connected to the plurality of vacuum valves, respectively, and
 the plurality of vacuum valves are connected to the vacuum adsorption source.

6. The chip peeling apparatus of claim 5, wherein
 the vacuum adsorption source is connected to an end of the first vacuum adsorption hole at the bottom surface of the peeling body,
 the vacuum adsorption source is connected to an end of the second vacuum adsorption hole at the first side surface of the peeling body, and
 the vacuum adsorption source is connected to an end of the third vacuum adsorption hole at the second side surface of the peeling body.

7. The chip peeling apparatus of claim 1, elaim 8, wherein
 the plurality of first air blow holes are connected to a plurality of pressurization valves, and the plurality of pressurization valves are connected to a pressurization source.

8. A chip peeling apparatus comprising:
a peeling device,
the peeling device including a plurality of vacuum adsorption holes and a plurality of first air blow holes arranged surrounding the plurality of vacuum adsorption holes; and
a pickup device above the peeling device, wherein
the pickup device is configured to adsorb a top surface of chip and to pick up the chip off a tape when the peeling device is below the tape and used to peel the chip off the tape,
the peeling device comprises a peeling body,
the plurality of vacuum adsorption holes comprise a first vacuum adsorption hole passing through the peeling body from a top surface of the peeling body to a bottom surface of the peeling body, a second vacuum adsorption hole passing through the peeling body from the top surface of the peeling body to a first side surface of the peeling body, and a third vacuum adsorption hole passing through the peeling body from the top surface of the peeling body to a second side surface of the peeling body,
the second side surface of the peeling body is opposite the first side surface of the peeling body.

9. The chip peeling apparatus of claim 8, wherein the pickup device comprises second air blow holes extending through a thickness direction of the pickup device.

10. The chip peeling apparatus of claim 9, wherein
the peeling device is configured to peel the chip off the tape by directing a first air blow to a region of the tape on which the chip is attached through the plurality of first air blow holes using a pressurization source, and
the pickup device is configured to promote peeling of the chip from the tape by directing a second air blow to the tape through the second air blow holes using the pressurization source.

11. The chip peeling apparatus of claim 10, wherein
the plurality of vacuum adsorption holes are apart from one another in an X-axis direction and a Y-axis direction crossing the X-axis direction in a plane.

12. The chip peeling apparatus of claim 10, wherein
the plurality of vacuum adsorption holes comprise a plurality of circular vacuum adsorption holes and a plurality of linear vacuum adsorption holes,
the plurality of circular vacuum adsorption holes are apart from one another in an X-axis direction and a Y-axis direction crossing the X-axis direction in a plane,
the plurality of linear vacuum adsorption holes surround the plurality of circular vacuum adsorption holes, and the first vacuum adsorption hole, the second vacuum adsorption hole, and the third vacuum adsorption hole are among the plurality of circular vacuum adsorption holes.

13. A chip peeling apparatus comprising:
a peeling device, the peeling device including a plurality of vacuum adsorption holes and a plurality of first air blow holes arranged surrounding the plurality of vacuum adsorption holes;
a pickup device above the peeling device, the pickup device being configured to adsorb a top surface of a chip and to pick up the chip off a tape when the peeling device is below the tape and used to peel the chip off the tape; and
an infrared camera at one side of the pickup device and configured to capture an image of the tape over the chip, wherein
the peeling device comprises a peeling body, and
the plurality of vacuum adsorption holes comprise a first vacuum adsorption hole passing through the peeling body from a top surface of the peeling body to a bottom surface of the peeling body, a second vacuum adsorption hole passing through the peeling body from the top surface of the peeling body to a first side surface of the peeling body, and a third vacuum adsorption hole passing through the peeling body from the top surface of the peeling body to a second side surface of the peeling body, and
the second side surface of the peeling body is opposite the first side surface of the peeling body.

14. The chip peeling apparatus of claim 13, wherein
the pickup device comprises a suction unit configured to apply suction to the top surface of the chip, and
the pickup device is configured to move the suction unit to a pickup position based on a captured image from the infrared camera.

15. The chip peeling apparatus of claim 13,
wherein the peeling device further comprises a plurality of pressurization valves connected to the plurality of first air blow holes and a pressurization source connected to the plurality of pressurization valves.

16. The chip peeling apparatus of claim 13,
wherein the peeling device further includes a plurality of vacuum valves and a vacuum adsorption source,
the plurality of vacuum adsorption holes are connected to the plurality of vacuum valves, and
the plurality of vacuum valves are connected to the vacuum adsorption source.

* * * * *